United States Patent
Ruelke et al.

(10) Patent No.: US 7,807,233 B2
(45) Date of Patent: Oct. 5, 2010

(54) METHOD OF FORMING A TEOS CAP LAYER AT LOW TEMPERATURE AND REDUCED DEPOSITION RATE

(75) Inventors: Hartmut Ruelke, Dresden (DE); Katja Huy, Dresden (DE); Karla Romero, Dresden (DE)

(73) Assignee: Globalfoundries Inc., Grand Cayman (KY)

( * ) Notice: Subject to any disclaimer, the term of this patent is extended or adjusted under 35 U.S.C. 154(b) by 501 days.

(21) Appl. No.: 10/835,411

(22) Filed: Apr. 29, 2004

(65) Prior Publication Data

US 2005/0048222 A1    Mar. 3, 2005

(30) Foreign Application Priority Data

Aug. 29, 2003   (DE)   ................. 103 39 988

(51) Int. Cl.
   *H05H 1/24*     (2006.01)
   *C23C 16/00*    (2006.01)
(52) U.S. Cl. ................ 427/569; 427/249.1; 427/255.23
(58) Field of Classification Search ............ 427/249.1, 427/255.23, 569
   See application file for complete search history.

(56) References Cited

U.S. PATENT DOCUMENTS

| | | | |
|---|---|---|---|
| 5,462,898 A | 10/1995 | Chen et al. | 437/235 |
| 5,670,298 A | 9/1997 | Hur | 430/318 |
| 5,681,425 A | 10/1997 | Chen | 156/643.1 |
| 5,759,746 A * | 6/1998 | Azuma et al. | 430/313 |
| 5,998,100 A | 12/1999 | Azuma et al. | 430/313 |
| 6,028,014 A | 2/2000 | Sukjarev | 438/789 |
| 6,057,226 A | 5/2000 | Wong | 438/623 |
| 6,066,577 A | 5/2000 | Cooney, III et al. | 438/787 |
| 6,406,975 B1 * | 6/2002 | Lim et al. | 438/421 |
| 2001/0045655 A1 | 11/2001 | Matsubara | 257/758 |
| 2002/0086509 A1 | 7/2002 | Park et al. | 438/586 |
| 2002/0192885 A1 * | 12/2002 | Miyasaka | 438/164 |

FOREIGN PATENT DOCUMENTS

| | | |
|---|---|---|
| EP | 0 272 140 A2 | 12/1987 |
| EP | 0 517 627 A1 | 12/1992 |
| JP | 08148569 A | 6/1996 |

OTHER PUBLICATIONS

Liu et al., "Generating Sub-30nm Poly-Silicon Gates Using PECVD Amorphous Carbon as Hardmask and Anti-Reflecting Coating," *Proceedings of SPIE*, 5040:841-48, 2003.

(Continued)

*Primary Examiner*—Timothy Meeks
*Assistant Examiner*—Kelly M Gambetta
(74) *Attorney, Agent, or Firm*—Williams, Morgan & Amerson, P.C.

(57) ABSTRACT

A method for forming a silicon dioxide cap layer for a carbon hard mask layer for patterning of polysilicon line features having critical dimensions of 50 nm and less is provided. To this end, a low temperature plasma enhanced CVD process is used in which the deposition rate is maintained low to provide improved controllability of the layer thickness and, thus, of the optical characteristics of the silicon dioxide layer.

24 Claims, 3 Drawing Sheets

OTHER PUBLICATIONS

Deshmukh and Aydil, "Investigation of low temperature SiO$_2$ plasma enhanced chemical vapor deposition," *J. Vac. Sci. Technol.*, 14-738-43, Mar./Apr. 1996.

Martinet et al., "Deposition of SiO$_2$ and TiO$_2$ thin films by plasma enhanced chemical vapor deposition for antireflection coating," *Journal of Non-Crystalline Solids*, 216:77-82, 1997.

\* cited by examiner

METHOD OF FORMING A TEOS CAP LAYER AT LOW TEMPERATURE AND REDUCED DEPOSITION RATE

BACKGROUND OF THE INVENTION

1. Field of the Invention

The present invention generally relates to the fabrication of integrated circuits, and, more particularly, to the formation of small circuit elements, such as a gate electrode of a field effect transistor, on a substrate by sophisticated trim etch techniques requiring advanced masking schemes, wherein the dimensions of the circuit elements are significantly less than the resolution of the involved lithography technique.

2. Description of the Related Art

The trend in recent years to steadily decrease the feature sizes of circuit elements in integrated circuits will continue in the near future, wherein reproducible and robust processes have to be established that allow the formation of a huge number of integrated circuits in a cost-efficient manner. Presently, sophisticated integrated circuits that are available as mass products include elements having dimensions which are well below the optical resolution of the lithography apparatus used for transferring a pattern from a mask into a material layer formed on a substrate. Minimum dimensions of circuit elements are presently 100 nm and less, wherein the wavelength of radiation used for optically transferring patterns from the mask to the substrate surface are in the deep ultraviolet range, for example at 248 nm, and, in recently developed techniques, at approximately 193 nm. In this wavelength range, the absorption of optical transmissive elements, such as lenses, is considerable and will drastically increase with a further reduction of the wavelength. Thus, merely reducing the wavelength of light sources for lithography apparatus is not a straightforward development and may not easily be implemented in mass production of circuit elements having feature sizes of 50 nm and less. Thus advanced trim processes are required so as to obtain the final desired dimension from the minimum dimension that may be achieved with resist features by lithography.

Hence, the total resolution of reliably transferring circuit patterns from a mask to a substrate is determined, on the one hand, by the intrinsic optical resolution of the photolithography apparatus, the characteristics of materials involved in the photolithography patterning process, such as the photoresist and any anti-reflective coatings (ARC) that are provided to minimize deleterious scattering and standing wave effects in the photoresist, and by deposition and etch procedures involved in forming the resist and ARC layers and etching these layers after exposure. In particular, the highly non-linear behavior of the photoresist, in combination with sophisticated ARC layers and lithography mask techniques, allows the formation of resist patterns having dimensions considerably below the intrinsic optical resolution of the photolithography apparatus. Additionally, a further post-lithography trim etch process is applied to further reduce the feature sizes of the resist pattern that will serve as an etch mask in subsequent anisotropic steps for transferring the resist pattern into the underlying material layer. Thus, this resist trim process enables the reduction of the critical dimension of the gate electrode to a size that is well beyond the wavelength of the photolithography.

It is, however, of great importance to accurately control the resist trim process so as to form a precisely defined mask for the subsequent anisotropic etch process for patterning the gate layer stack, since any variation of the gate length directly translates into a corresponding variation of operating speed of the final device. Since the continuous device scaling requires extending the concept of resist trimming even further to obtain the desired reduced critical dimension for a given exposure wavelength, the resist layer thickness has to be adapted to the increased resist material removal during the trim process, thereby significantly deteriorating the optical characteristics of the layer stack comprised of the resist and the bottom anti-reflective coating (ARC). Particularly the reflectivity of the bottom ARC significantly affects the line width after the lithography and causes variations thereof that may not be efficiently compensated for by the subsequent trim process within the tight process tolerances dictated by the design rules.

For this reason, a process technique has recently been developed that proposes the formation of an amorphous carbon layer in combination with a dielectric cap layer as a bottom ARC, thereby providing significantly enhanced control of the reflectivity. Additionally, the carbon/cap layer stack may readily be patterned corresponding to the trimmed resist feature with a reduced resist layer thickness, thereby forming a hard mask feature in the carbon/cap layer stack that is used to etch the polysilicon layer.

With reference to FIGS. 1a-1c, a typical conventional process flow for forming a gate electrode of a field effect transistor on the basis of a carbon/cap layer stack is described in more detail.

FIG. 1a schematically shows a cross-sectional view of a semiconductor device 100 prior to patterning of a material layer on the basis of an advanced photolithography process using a wavelength of 248 nm or 193 nm and on the basis of an advanced etch process with the aid of a hard mask that, in turn, is patterned by a resist mask feature, which is trimmed by a corresponding resist trim process.

The semiconductor device 100 comprises a substrate 101, for instance a silicon substrate or a silicon-on-insulator (SOI) substrate having formed thereon the material layer to be patterned, such as a gate layer stack 102 including a gate insulation layer 103 and a polysilicon layer 104. An amorphous carbon layer 105 is formed on the polysilicon layer 104, followed by a cap layer 106, which may conventionally be comprised of silicon dioxide, silicon oxynitride, nitrogen-free dielectric layers, and the like, wherein silicon oxynitride may be used due to its capability of adjusting the optical characteristics by varying the oxygen/nitrogen ratio. The amorphous carbon layer 105 and the cap layer 106 are designed in such a manner that they act in combination as an efficient anti-reflective coating for the specified exposure wavelength and for the type of resist used. As previously discussed, the reflectivity of an anti-reflective coating during the patterning of a polysilicon layer may significantly affect the accuracy of the resist trim process, thereby also influencing the finally-obtained gate length of the polysilicon feature. For a gate length of 50 nm or less, a deviation of less than one nanometer is mandatory to meet the device specifications. Hence, a high degree of uniformity of the reflectivity provided by the anti-reflective coating formed by the layers 106 and 105 across the entire substrate 101 as well as from substrate to substrate is required so as to reduce the variations in size of a resist mask feature 107 having an initial lateral size 108 and an initial height 109.

A typical process flow for forming the semiconductor device 100 as shown in FIG. 1a may comprise the following processes. First, the gate layer stack 102 is formed, wherein the gate insulation layer 103 may be formed by advanced oxidation and/or deposition processes so as to obtain the required thickness and material composition for a gate dielectric. Subsequently, the polysilicon layer 104 may be deposited by low pressure chemical vapor deposition (LPCVD) in conformity with well-established process recipes. Thereafter, the amorphous carbon layer 105 is deposited by plasma enhanced CVD from appropriate precursors, wherein a thickness of the layer 105 is adjusted in view of its optical characteristics as well as in view of its etch selectivity during a subsequent anisotropic etch process for patterning the polysilicon layer 104.

Next, the cap layer 106, for instance comprised of silicon oxynitride, may be deposited by PECVD, wherein the thickness and the material composition of the cap layer 106 is selected so as to provide the required phase shifting of the specified exposure wavelength, thereby reducing, in combination with the amorphous carbon layer 105, the back reflection of exposure radiation during the lithography exposure.

Thereafter, a layer of photoresist is deposited, the characteristics of which are adapted to the specified exposure wavelength used during the lithography process, wherein a thickness of the resist layer substantially corresponds to the initial height 109 of the resist mask feature 107, except for a certain degree of shrinkage during any pre- and post-exposure bake processes. To accomplish a high resolution of the lithography process owing to a given depth of focus, it is necessary to provide the resist layer with a thickness of approximately 100-300 nm, depending on the exposure wavelength used. The size reduction of the resist mask feature 107A, depicted in dashed lines, after exposure and development of the resist layer from the initial lateral size 108 to a desired final lateral size 108A, however, is accompanied by a corresponding reduction of the initial height 109 to a final height 109A. The final height 109A may not be sufficient to serve as an etch mask for patterning the polysilicon layer 104 directly, which is a typical process flow for semiconductor devices requiring a gate length on the order of approximately 80-100 nm. For this reason, the amorphous carbon layer 105 is provided and may readily be patterned by reactive ion etching, wherein the final height 109A of the resist mask feature 107, after being subjected to a resist trim process so as to become the reduced resist mask feature 107A, is sufficient to allow reliable patterning of the amorphous carbon layer 105 and the cap layer 106. The cap layer 106 is necessary for substantially avoiding direct contact of the resist layer with the underlying amorphous carbon layer 105, which may otherwise result in resist poisoning and an increased defect rate of the finally obtained polysilicon feature. The reason for this may be chemical reaction between the carbon and the photoresist at the interface thereof, thereby possibly altering the optical characteristics of the photoresist and causing insufficiently developed resist portions that may then be patterned into the polysilicon line 104.

FIG. 1b schematically shows the semiconductor device 100 after completion of the resist trim process and the subsequent reactive ion etching so as to form a hard mask comprised of the residue 105A of the carbon layer 105 and the residue 106A of the cap layer 106 by means of the reduced resist mask feature 107A. Thereafter, the reduced resist mask feature 107A may be removed prior to anisotropically etching the polysilicon layer 104, wherein the thin cap layer residue 106A may also be consumed, while the amorphous carbon layer residue 105A provides the required etch selectivity and allows transfer of the lateral dimension 108A into the polysilicon layer 104.

FIG. 1c schematically shows the semiconductor device 100 after completion of the anisotropic etch process, thereby forming a polysilicon feature 104A substantially exhibiting the lateral size 108A. Although the process flow illustrated above allows formation of polysilicon features 104A having a lateral size 108A of 50 nm and less, it turns out, however, that a moderately high defect rate of the polysilicon features 104A is observed. Correspondingly performed investigations seem to indicate that the defect rate is correlated with the type of cap layer 106 used for defining the hard mask 105A. For instance, a cap layer 106 comprised of silicon oyxnitride exhibits a significant defect rate, thereby rendering the formation process unreliable, while the provision of a cap layer 106 in the form of a silicon dioxide may have the potential to reduce the defect rate, wherein a corresponding conventional deposition process may not be controlled in a reliable manner according to presently available process recipes.

In view of the problems identified above, there is a need for an improved process for forming a cap layer for patterning polysilicon features by means of a carbon hard mask, wherein a defect rate is reduced and process reliability is enhanced.

SUMMARY OF THE INVENTION

Generally, the present invention is directed to a method for forming a silicon dioxide cap layer on an amorphous carbon hard mask layer for patterning a polysilicon feature. Without restricting the present invention to the following explanation, it is believed that the provision of a silicon dioxide layer formed by plasma enhanced chemical vapor deposition at temperatures of 370° C. and less may significantly reduce the defectiveness of the finally obtained polysilicon features. Based on this finding, the plasma enhanced CVD process for forming a silicon dioxide layer is designed so as to enable reliable control of a thickness of the silicon dioxide layer within a range of 5-50 nm, as is required for providing the desired optical characteristics in combination with the underlying amorphous carbon layer. Since, typically, a TEOS-based plasma enhanced CVD process exhibits an enhanced deposition rate at lower temperatures, which, according to the present invention, are required to reduce the defect rate, in some embodiments, the deposition process is controlled to provide a reduced deposition rate so as to enable a reliable control of the layer thickness, thereby assuring the required optical characteristics of the silicon dioxide/amorphous carbon layer stack.

According to one illustrative embodiment of the present invention, a method of forming a silicon dioxide cap layer comprises forming an amorphous carbon layer above a substrate and depositing silicon dioxide from TEOS in a plasma atmosphere on the amorphous carbon layer at a temperature of approximately 370° C. or less to form the cap layer with a thickness in the range of approximately 5-50 nm.

According to still a further illustrative embodiment of the present invention, a method of forming an anti-reflective layer comprises forming a material layer to be patterned above a substrate and forming an amorphous carbon layer of a first thickness above the material layer. Further, a silicon dioxide layer of a second thickness is formed at a temperature of less than approximately 370° C. on the amorphous carbon layer, wherein the first and the second thicknesses are selected so as to generate a reflectivity at a specified exposure wavelength that is approximately 2% or less.

BRIEF DESCRIPTION OF THE DRAWINGS

The invention may be understood by reference to the following description taken in conjunction with the accompanying drawings, in which like reference numerals identify like elements, and in which.

Figure 1A:
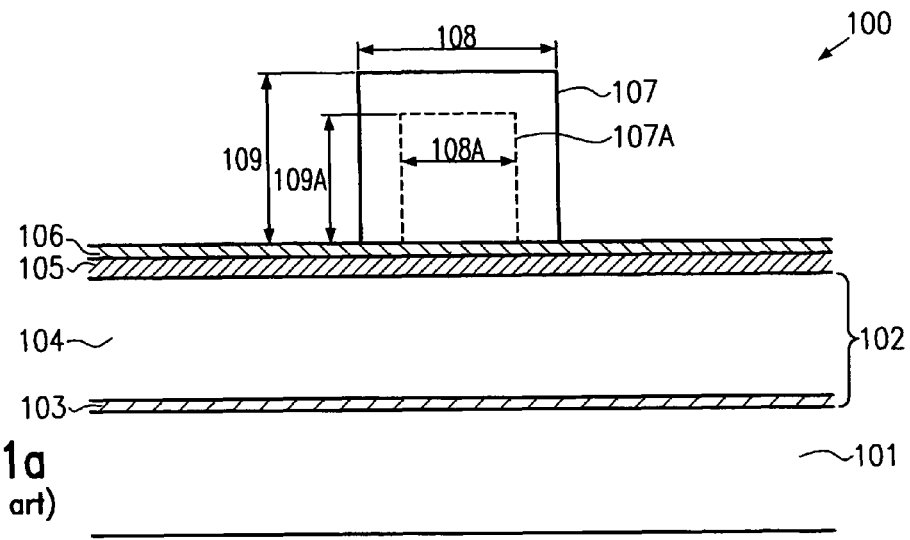
FIGS. 1a-1c schematically show cross-sectional views of a semiconductor device during various manufacturing stages for forming a polysilicon line feature by means of an amorphous carbon hard mask according to a conventional process flow.
Figure 1B:
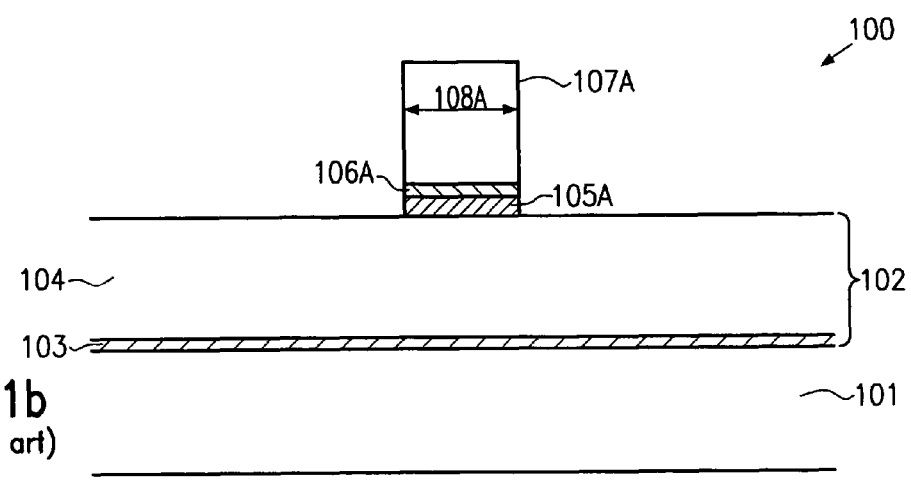
Figure 1C:
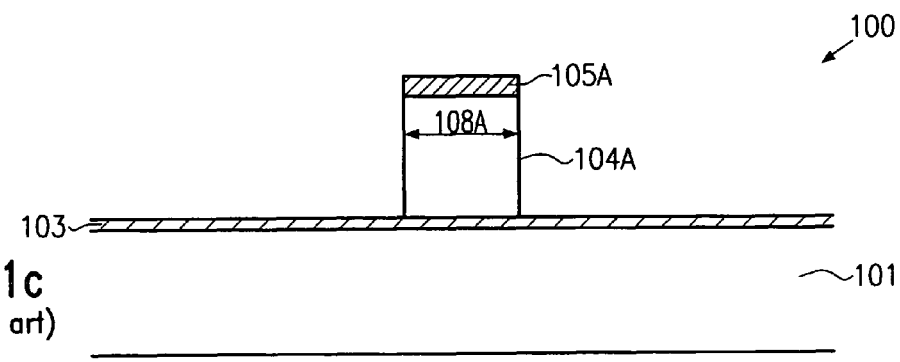

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2A:
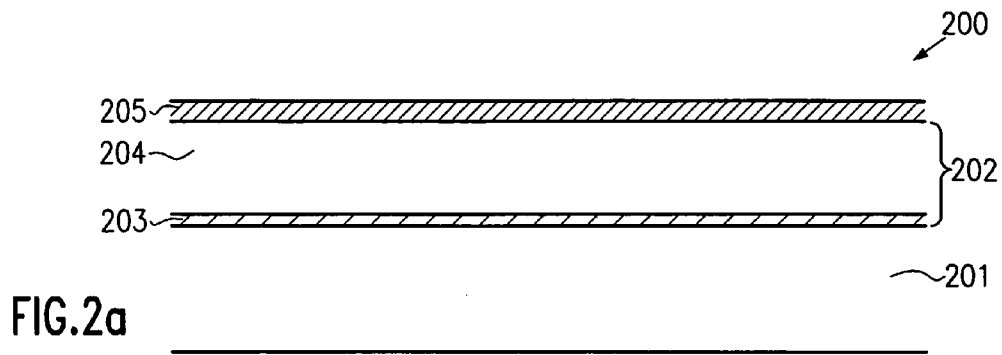
FIGS. 2a-2e schematically show cross-sectional views of a semiconductor structure in various manufacturing stages for patterning a polysilicon layer by means of a carbon hard mask using a silicon dioxide cap layer formed at low temperature in accordance with illustrative embodiments of the present invention.

With reference to FIGS. 2a-2e, further illustrative embodiments of the present invention will now be described in more detail. In FIG. 2a, a semiconductor structure 200 comprises a substrate 201, for instance a silicon substrate, an SOI substrate or any other appropriate substrate having formed thereon a semiconductive layer that is suitable for forming circuit elements therein. A material layer 204 that is to be patterned in conformity with specified design rules is formed above the substrate 201, wherein the material layer 204 may be part of a layer stack 202. For instance, the layer stack 202 may represent a gate layer stack including a gate insulation 203 and the material layer 204 in the form of a polysilicon layer. The layer stack 202 may, however, include any other appropriate material layers that are required for the formation of circuit elements of present and future device generations. A carbon layer 205 substantially comprised of amorphous carbon is located on the layer stack 202, wherein a thickness of the carbon layer 205 is appropriately selected with respect to an etch selectivity to the underlying material layer 204 that is to be patterned in a subsequent anisotropic etch process to form circuit elements, such as gate electrodes for highly advanced field effect transistors having a gate length of less than 80 nm and, particularly, of less than 50 nm. For instance, the anisotropic etch process under consideration may define an etch selectivity of the carbon layer 205 to the polysilicon layer 204 of approximately 1:10 or less, so that a thickness of the carbon layer 205 is selected to be approximately 30-50% of the thickness of the polysilicon layer 204 to provide a sufficient safety margin.

A typical process flow for forming the semiconductor structure 200 as shown in FIG. 2a may include processes as previously described with reference to FIG. 1a and, hence, any detailed description thereof is omitted here. It should be noted in this context, however, that the carbon layer 205 may be formed by plasma enhanced CVD with any appropriate deposition tool. For instance, in one embodiment, the carbon layer 205 may be formed with a deposition tool available from Applied Materials under the names of Producer™ or DXZ™.

Figure 2B:
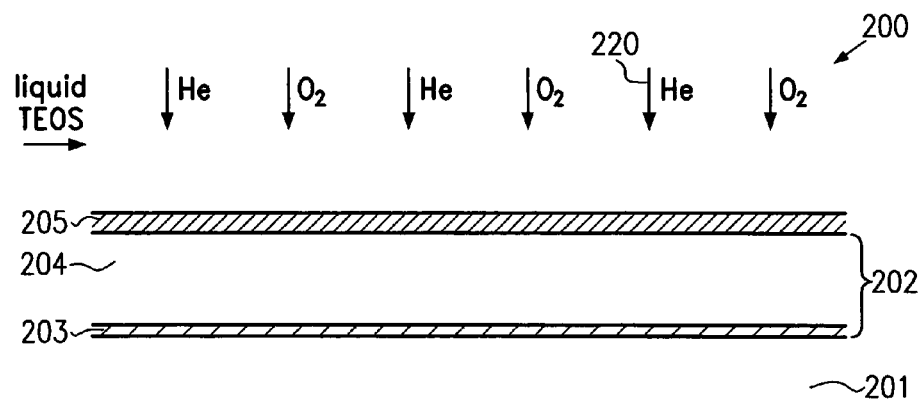

FIG. 2b schematically shows the semiconductor structure 200 in an advanced manufacturing stage. The semiconductor structure 200 is exposed to a gaseous ambient 220, which may be established within the same deposition tool as previously used for the formation of the carbon layer 205, or any other different appropriate deposition tool may be used. In view of tool utilization and throughput, in one particular embodiment, the above-specified deposition tool from Applied Materials may be employed. The gaseous ambient 220 may be defined by a specified pressure ranging from approximately 4.5-Torr, for instance, about 5.5 Torr. Moreover, an inert carrier gas, such as helium, and a reactive component, such as oxygen, may be supplied to the gaseous ambient 220 so as to provide an appropriate gas mixture and concentration over the carbon layer 205. In one particular embodiment, the carrier gas and the oxygen are supplied at approximately similar flow rates, wherein the value may be, depending on the specifics of the deposition tool, in the range of 2500-3500 sccm, for instance, approximately 3000 sccm. At the same time, liquid TEOS (tetra-ethyl-orthosilicate) may be supplied by a corresponding liquid injection system as is typically incorporated in conventional PECVD tools. A typical supply rate of TEOS may range, depending on the geometric specifics of the deposition tool, from approximately 400-600 mg/minute, for instance, approximately 500 mg/minute. During the exposure of the semiconductor structure 200 to the gaseous ambient 220, the substrate 201 may be maintained at a substantially constant temperature, which may be equal to or less than 370° C., and, in one particular embodiment, the substrate 201 may be kept at a temperature of approximately 280-330° C., for instance, the substrate 201 may be maintained at approximately 300° C. The gaseous ambient 220 is established so as to "prepare" the semiconductor structure 200 for a subsequent low temperature silicon dioxide deposition, in which the deposition rate is sufficiently reduced so as to enable control of the thickness and, thus, the optical characteristics of the finally obtained silicon dioxide layer.

In particular embodiments of the present invention, the establishment of the gaseous ambient 220 may be preceded by one or more stabilization steps for bringing the substrate 201 to the desired temperature without any significant gas flow or pumping activity for reducing the ambient pressure prevailing around the substrate 201. Moreover, the distance of the substrate 201 with respect to a showerhead delivering carrier gases and reactive gases during the deposition may be adjusted to the desired value as is used during the actual deposition step. Furthermore, a carrier gas, such as helium, may then be introduced and, subsequently, oxygen may also be supplied to the gaseous ambient while the pressure is adjusted to a range of approximately less than 10 Torr, but still significantly higher than the pressure during the actual deposition step.

In a further stabilization step, the pressure may be reduced to the actual deposition pressure while an increased amount of liquid TEOS, for example in the range of approximately 700 mg/min, is supplied to the gaseous ambient 220 so as to "flush" the surface of the substrate 201 and the gaseous ambient 220 with gaseous TEOS. Next, an adaptation step may be performed so as to adjust the TEOS supply rate to the actual supply rate during the deposition, as is specified above, so as to "prepare" the ambient 220 for an appropriately low silicon dioxide deposition rate.

Figure 2C:
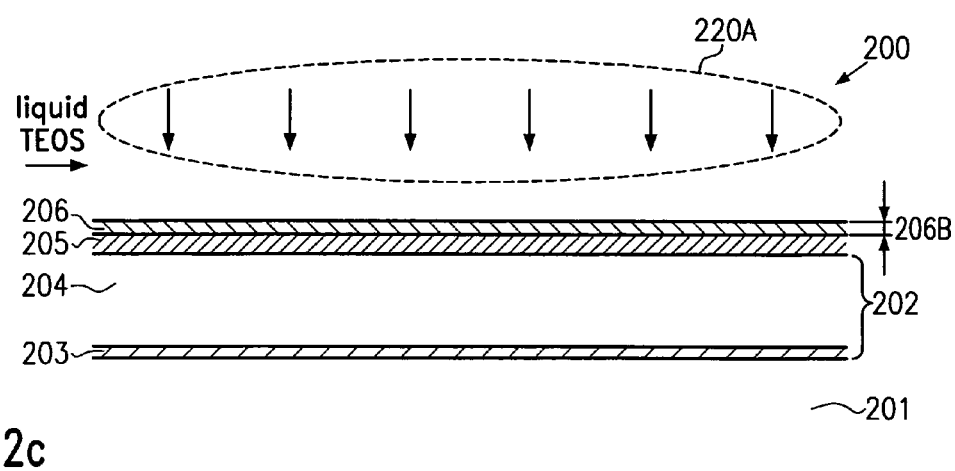

FIG. 2c schematically shows the semiconductor structure 200 during the actual deposition of silicon dioxide. To this end, a plasma atmosphere 220A is established by activating a corresponding plasma excitation means (not shown), as is typically provided in conventional PECVD tools. During the deposition, the parameters of the gaseous ambient 220 described with reference to FIG. 2b are substantially maintained constant, wherein a deposition rate is achieved in the range of approximately 200-400 nm/min. Hence, the deposition rate is sufficiently high so as to assure a reasonable throughput, while, on the other hand, control of a thickness 206B of a silicon dioxide layer 206 formed on the carbon layer 205 may be accomplished by appropriately selecting the deposition time.

In one particular embodiment, the deposition time is selected so as to obtain the thickness 206B in the range of approximately 5-50 nm, and in other particular embodiments of approximately 8-40 nm within approximately 3-10 seconds. As previously discussed, the optical characteristics of the silicon dioxide layer 206 may be adjusted by controlling the thickness 206B such that, in combination with the carbon layer 205, the desired low reflectivity at the specified exposure wavelength is obtained. Since the index of refraction of PECVD-deposited silicon dioxide is well known, or the corresponding data may readily be determined for the above-specified deposition parameters by measuring a corresponding test substrate having formed thereon a silicon dioxide layer produced by the above-specified deposition parameters, an appropriate desired value for the thickness 206B may be determined in advance and the deposition may then be controlled on the basis of desired thickness.

The process of depositing silicon dioxide to form the layer 206 may be discontinued by deactivating the plasma excitation means and/or by discontinuing the TEOS supply. Thereafter, a pump step may be performed with the TEOS supply interrupted and with a reduced flow rate of the carrier gas, such as helium, and a reduced oxygen flow rate. In one embodiment, the oxygen flow rate may be reduced by more than 50% compared to the deposition flow rate, while the helium flow rate is less than the oxygen flow rate. Finally, the oxygen supply may be discontinued while maintaining a helium supply and, thereafter, the supply of all gases may be discontinued while still removing reaction by-products by continued pumping.

In one particular embodiment, a deposition recipe may be used for establishing the gaseous ambient 220, stabilizing the same, providing the plasma atmosphere 220A and removing gas by-products by pumping, wherein the recipe may include the following steps:

stabilization of the ambience of the substrate 201 at a temperature of approximately 300° C. with no gas supply for 8-12 seconds; configuring a corresponding process chamber geometry, i.e., setting a distance between the showerhead and the substrate 201, in conformity with the deposition geometry, while still providing no gas flow and maintaining the temperature at the deposition temperature for approximately 8-12 seconds;

introducing helium with a flow rate that substantially corresponds to the deposition flow rate for approximately 4-6 seconds; establishing the gaseous ambient 220 by supplying oxygen with the deposition flow rate of, for instance, approximately 3000 sccm at an increased pressure of approximately 9 Torr for 8-12 seconds;

activating the TEOS supply with an increased supply rate of, for instance, approximately 750-850 mg/min while reducing the ambient pressure to the deposition pressure, for instance, to approximately 5.5 Torr;

ramping the TEOS contents within the gaseous ambient 220 to a required deposition value by reducing the supply rate to approximately 450-550 mg/min for 13-17 seconds while maintaining the remaining parameters substantially constant;

establishing the plasma atmosphere 220A with substantially unchanged parameters while controlling the deposition time within an interval of approximately 3-8 seconds so as to obtain the final silicon dioxide thickness in the range of approximately 5-50 nm;

reducing the helium and oxygen flow rates while discontinuing the TEOS supply and the plasma generation, wherein the helium flow rate may be adjusted to approximately 1000-1200 sccm and the flow rate of oxygen may be adjusted to approximately 1200-1400 sccm for 2-5 seconds;

discontinuing the oxygen supply while maintaining the helium supply or increasing the helium flow rate to approximately 1200-1400 sccm while still pumping off reaction by-products; and discontinuing the supply of all gases while still removing by-products for approximately 9-13 seconds.

Figure 2D:
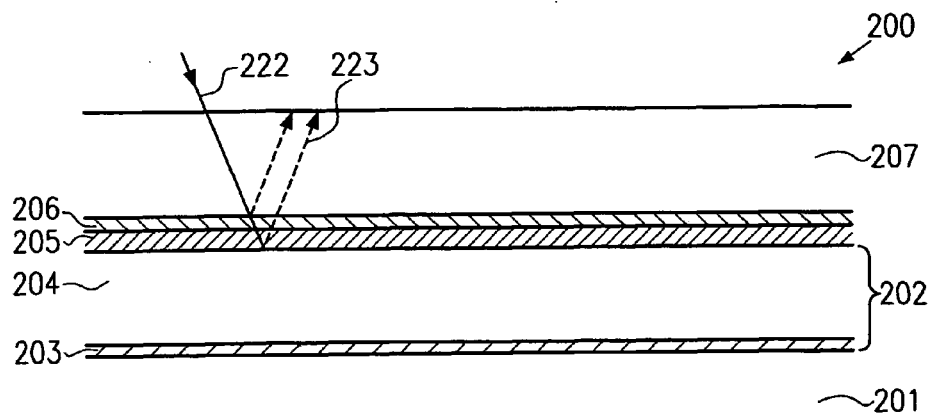

FIG. 2d schematically shows the semiconductor structure 200 after completion of the deposition of the silicon dioxide layer 206 according to any of the above-described deposition methods. Moreover, a resist layer 207 is formed on the silicon dioxide layer 206, wherein the silicon dioxide layer 206 in combination with the carbon layer 205 act as an anti-reflective layer so as to reduce the reflection of an incoming UV light beam 222 that is scattered back into the resist layer 207 as a reflected or scattered light beam 223 having an intensity of approximately 2% or less. As previously discussed, the resist layer 207 is adapted to the photolithography, i.e., the specified exposure wavelength, wherein additionally a thickness of the resist layer 207 is selected so as to provide the required coverage during a subsequent etch process for patterning the layers 206 and 205. For instance, in a 193 nm lithography process, the resist layer thickness is restricted by the depth of focus of the lithography tool and, hence, typically thinner resist layers are required as compared to a 248 nm lithography. Due to the well-controllable deposition process for forming the silicon dioxide layer 206, however, the reflectivity, i.e., the intensity ratio of the beams 223 and 222, may be reduced to 2% or even less.

At the same time, the silicon dioxide layer formed in accordance with the low temperature process described above provides a sufficiently stable interface with the carbon layer 205 and also reliably suppresses any chemical reaction between the photoresist in the layer 207 and the carbon layer 205, thereby significantly reducing the defect rate in the finally obtained patterned polysilicon features. After exposure and development of the resist layer 207, a resist trim process may be performed with a well-established etch chemistry to obtain the finally desired lateral size of a corresponding resist feature, which is then used as an etch mask for patterning the layers 206 and 205. Corresponding etch recipes are well established and allow patterning of the layers 206 and 205 by a breakthrough etch step and a subsequent anisotropic etch process, respectively, with an initial height of the resist layer 207 of approximately 300 nm or even less.

Figure 2E:
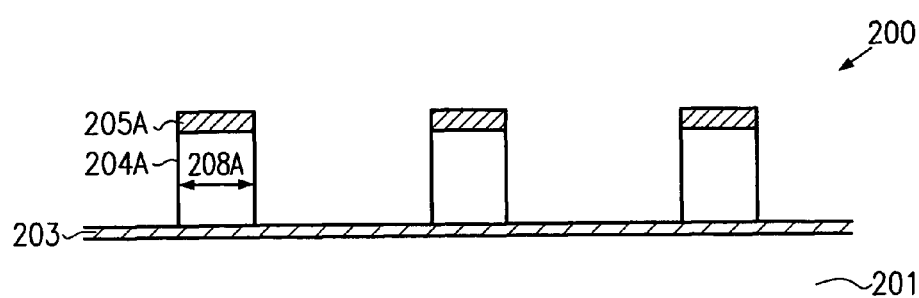

FIG. 2e schematically shows a plurality of polysilicon features 204A still covered by carbon etch hard mask features 205A, while the residue of the cap layer 206 has been "consumed" during the etch process for patterning the polysilicon layer 204 to form the polysilicon feature 204A substantially exhibiting the desired lateral size 208A. Due to the low temperature plasma enhanced CVD process, a defect rate, i.e., the number of polysilicon features 204A that are damaged or that do not conform to the specifications or that otherwise exhibit polysilicon residues or have significantly deviating lateral sizes, is reduced, so that polysilicon features 204A with the desired lateral size 208A of 50 nm and less, for instance, 45 nm and less, may be manufactured with a 193 nm lithography process or even with a 248 nm lithography process. Depending on the specifics of the photolithography and etch process, a defect rate of the polysilicon features, such as the features 204A fabricated on test substrates with a 193 nm lithography resist may be approximately 10 times less compared to features fabricated in a conventional process flow using, for instance, a silicon oxynitride cap layer. The significantly reduced defect rate is believed to originate from a reduced degree of resist poisoning that may be caused by a reaction between nitrogen and the 193 nm resist.

As a result, the present invention provides an improved technique for forming a silicon dioxide layer by means of a low temperature plasma enhanced CVD process that enables high process control due to the moderately low deposition rate, so that the optical characteristics of the silicon dioxide layer may be precisely adapted to the underlying carbon layer, which then act, in combination, as an efficient anti-reflective coating having a reflectivity of 2% or less. Moreover, the low temperature PECVD deposition produces a reduced defect rate compared to conventional approaches, thereby enhancing process robustness and providing the potential for further device scaling on the basis of a 248 nm or 193 nm lithography process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a silicon dioxide cap layer, the method comprising:

forming at least one layer on a substrate;

forming an amorphous carbon layer above the at least one layer;

performing a deposition process for depositing silicon dioxide from TEOS in a plasma atmosphere on said amorphous carbon layer at a temperature of approximately 370° C. or less to form said cap layer with a thickness in the range of approximately 5-50 nm, said amorphous carbon layer and said cap layer cooperating to form an anti-reflective layer;

controlling a deposition rate of the silicon dioxide from TEOS in the deposition process by adjusting a pressure of said plasma atmosphere to a range of approximately 4.5-6.5 Torr; and patterning the at least one layer formed on said substrate in the presence of said anti-reflective layer, wherein said deposition process reduces an occurrence of defects in said at least one layer arising from said patterning.

2. The method of claim 1, wherein said silicon dioxide is deposited at a temperature of approximately 330° C. or less.

3. The method of claim 1, wherein said silicon dioxide is deposited at a temperature in a range of approximately 280-320° C.

4. The method of claim 1, wherein said silicon dioxide is deposited at a temperature of approximately 300° C.

5. The method of claim 1, further comprising adjusting the TEOS supply to approximately 600 milligram per minute or less.

6. The method of claim 5, wherein said TEOS supply is adjusted to a range of approximately 450-550 mg/minute.

7. The method of claim 6, wherein said TEOS supply is adjusted to approximately 500 mg/minute.

8. The method of claim 1, further comprising supplying helium and oxygen at substantially equal flow rates to said plasma atmosphere.

9. The method of claim 1, further comprising supplying helium and oxygen to an ambient of said substrate prior to depositing said silicon dioxide.

10. The method of claim 8, further comprising removing reaction by-products after depositing said silicon dioxide by pumping while supplying helium and oxygen with flow rates that are less than the flow rate during the deposition.

11. A method of forming an anti-reflective layer, the method comprising:

forming a material layer to be patterned above a substrate;

forming an amorphous carbon layer of a first thickness above said material layer;

performing a deposition process for forming a silicon dioxide layer of a second thickness in a plasma atmosphere at a temperature of less than or equal to 370° C. on said amorphous carbon layer;

controlling a deposition rate of said silicon dioxide layer during the deposition process by adjusting a pressure of said plasma atmosphere to a range of approximately 4.5-6.5 Torr, wherein said first and second thicknesses are selected so as to generate a reflectivity at a specified exposure wavelength that is approximately 2% or less; and patterning said material layer in the presence of said anti-reflective layer, wherein said deposition process reduces an occurrence of defects in said material layer arising from said patterning.

12. The method of claim 11, wherein said second thickness is adjusted to a range of approximately 5-50 nm.

13. The method of claim 11, wherein said silicon dioxide is formed by plasma enhanced chemical vapor deposition with TEOS as a precursor.

14. The method of claim 13, further comprising controlling a deposition rate during said plasma enhanced chemical vapor deposition to a range of approximately 200-400 nm/minute.

15. The method of claim 14, wherein said deposition rate is adjusted to a range of approximately 280-320 nm/minute.

16. The method of claim 13, wherein said silicon dioxide is deposited at a temperature of approximately 330° C. or less.

17. The method of claim 16, wherein said silicon dioxide is deposited at a temperature in a range of approximately 280-320° C.

18. The method of claim 17, wherein said silicon dioxide is deposited at a temperature of approximately 300° C.

19. The method of claim 11, further comprising adjusting the TEOS supply to approximately 600 mg/minute or less.

20. The method of claim 19, wherein said TEOS supply is adjusted to a range of approximately 450-550 mg/minute.

21. The method of claim 20, wherein said TEOS supply is adjusted to approximately 500 mg/minute.

22. The method of claim 13, further comprising supplying helium and oxygen at substantially equal flow rates to a plasma atmosphere during the plasma enhanced chemical vapor deposition.

23. The method of claim 13, further comprising supplying helium and oxygen to an ambient of said substrate prior to depositing said silicon dioxide.

24. The method of claim 22, further comprising removing reaction by-products after depositing said silicon dioxide by pumping while supplying helium and oxygen with flow rates that are less than the flow rate during the deposition.

\* \* \* \* \*